United States Patent
Lin et al.

(10) Patent No.: US 10,971,590 B2
(45) Date of Patent: *Apr. 6, 2021

(54) TRANSISTOR LAYOUT TO REDUCE KINK EFFECT

(71) Applicant: Taiwan Semiconductor Manufacturing Co., Ltd., Hsin-Chu (TW)

(72) Inventors: Meng-Han Lin, Hsinchu (TW); Te-Hsin Chiu, Miaoli County (TW); Wei Cheng Wu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/661,108

(22) Filed: Oct. 23, 2019

(65) Prior Publication Data

US 2020/0058749 A1 Feb. 20, 2020

Related U.S. Application Data

(63) Continuation of application No. 15/989,606, filed on May 25, 2018, now Pat. No. 10,510,855.
(Continued)

(51) Int. Cl.
*H01L 29/00* (2006.01)
*H01L 29/423* (2006.01)
(Continued)

(52) U.S. Cl.
CPC .. *H01L 29/42376* (2013.01); *H01L 21/28123* (2013.01); *H01L 21/76224* (2013.01);
(Continued)

(58) Field of Classification Search
None
See application file for complete search history.

(56) References Cited

U.S. PATENT DOCUMENTS 6,153,478 A 11/2000 Lin et al.
6,541,351 B1 4/2003 Bartlau et al.
(Continued)

FOREIGN PATENT DOCUMENTS

JP 2011071431 A 4/2011
KR 20080003556 A 1/2008
KR 20150122295 A 11/2015

OTHER PUBLICATIONS

Sonnet, Sachin. "Conquering the 'Kink' in Sub-Threshold Power Mosfet Behavior: A Simple Compact Modeling Approach." EDN Network. Jan. 6, 2015.
(Continued)

*Primary Examiner* — Reema Patel
(74) *Attorney, Agent, or Firm* — Eschweiler & Potashnik, LLC

(57) ABSTRACT

The present disclosure, in some embodiments, relates to an integrated chip. The integrated chip includes a substrate having interior surfaces that define a trench within an upper surface of the substrate. One or more dielectric materials are disposed within the trench. A source region disposed within the substrate and a drain region is disposed within of the substrate and separated from the source region along a first direction. A gate structure is over the upper surface of the substrate between the source region and the drain region. The upper surface of the substrate has a first width directly below the gate structure that is larger than a second width of the upper surface of the substrate within the source region or the drain region. The first width and the second width are measured along a second direction that is perpendicular to the first direction.

20 Claims, 10 Drawing Sheets

Related U.S. Application Data

(60) Provisional application No. 62/585,636, filed on Nov. 14, 2017.

(51) Int. Cl.

| | | |
|---|---|---|
| *H01L 29/10* | (2006.01) | |
| *H01L 29/78* | (2006.01) | |
| *H01L 29/08* | (2006.01) | |
| *H01L 29/66* | (2006.01) | |
| *H01L 21/762* | (2006.01) | |
| *H01L 29/06* | (2006.01) | |
| *H01L 21/28* | (2006.01) | |

(52) U.S. Cl.
CPC ...... *H01L 29/0692* (2013.01); *H01L 29/0847* (2013.01); *H01L 29/1033* (2013.01); *H01L 29/4238* (2013.01); *H01L 29/6659* (2013.01); *H01L 29/66598* (2013.01); *H01L 29/7833* (2013.01); *H01L 29/7834* (2013.01); *H01L 29/665* (2013.01)

(56) References Cited

U.S. PATENT DOCUMENTS

| | | |
|---|---|---|
| 7,304,354 B2 | 12/2007 | Morris |
| 7,514,940 B1 | 4/2009 | Bu |
| 7,932,143 B1 | 4/2011 | Pal et al. |
| 10,468,410 B2 | 11/2019 | Lin et al. |
| 2004/0126990 A1 | 7/2004 | Ohta |
| 2007/0075351 A1 | 4/2007 | Schulz et al. |
| 2008/0124872 A1 | 5/2008 | Verma et al. |
| 2009/0140334 A1 | 6/2009 | Chang |
| 2009/0181477 A1 | 7/2009 | King |
| 2011/0198699 A1 | 8/2011 | Hung et al. |
| 2011/0309417 A1 | 12/2011 | Wang et al. |
| 2012/0001271 A1* | 1/2012 | Chae .................. H01L 29/4238 257/401 |
| 2012/0292665 A1 | 11/2012 | Marino et al. |
| 2014/0167177 A1 | 6/2014 | Kim et al. |
| 2016/0190305 A1 | 6/2016 | JangJian et al. |
| 2017/0170278 A1 | 6/2017 | Peng et al. |
| 2018/0190773 A1 | 7/2018 | Huang |
| 2019/0378905 A1* | 12/2019 | Lin .................. H01L 29/42376 |

OTHER PUBLICATIONS

CH. Hollauer: Modeling of Thermal Oxidation and Stress Effects. The date of publication is unknown. Retrieved online on Oct. 16, 2017 from http://www.iue.tuwien.ac.at/phd/hollauer/node7.html.

Evans, David, "Microelectronic Device Fabrication I, Lecture 5: The Effect of Electric Field on the Semiconductor Surface." Portland State University. The date of publication is unknown, retrieved online on Nov. 14, 2017 from http://web.pdx.edu/~davide/notes.pdf.

Anonymous Author. "2. The Threshold Voltage." Apr. 9, 2018. retrieved from https://nanopdf.com/download/2-threshold-voltage_pdf#.

U.S. Appl. No. 15/989,648, filed May 25, 2018.

U.S. Appl. No. 16/217,405, filed Dec. 12, 2018.

Non Final Office Action dated Mar. 21, 2019 in connection with U.S. Appl. No. 15/989,648.

Notice of Allowance dated Sep. 25, 2019 in connection with U.S. Appl. No. 15/989,606.

Notice of Allowance dated Mar. 24, 2020 in connection with U.S. Appl. No. 16/574,205.

Non-Final Office Action dated Jan. 23, 2020 in connection with U.S. Appl. No. 16/217,405.

Non-Final Office Action dated Dec. 11, 2019 in connection with U.S. Appl. No. 16/574,205.

* cited by examiner

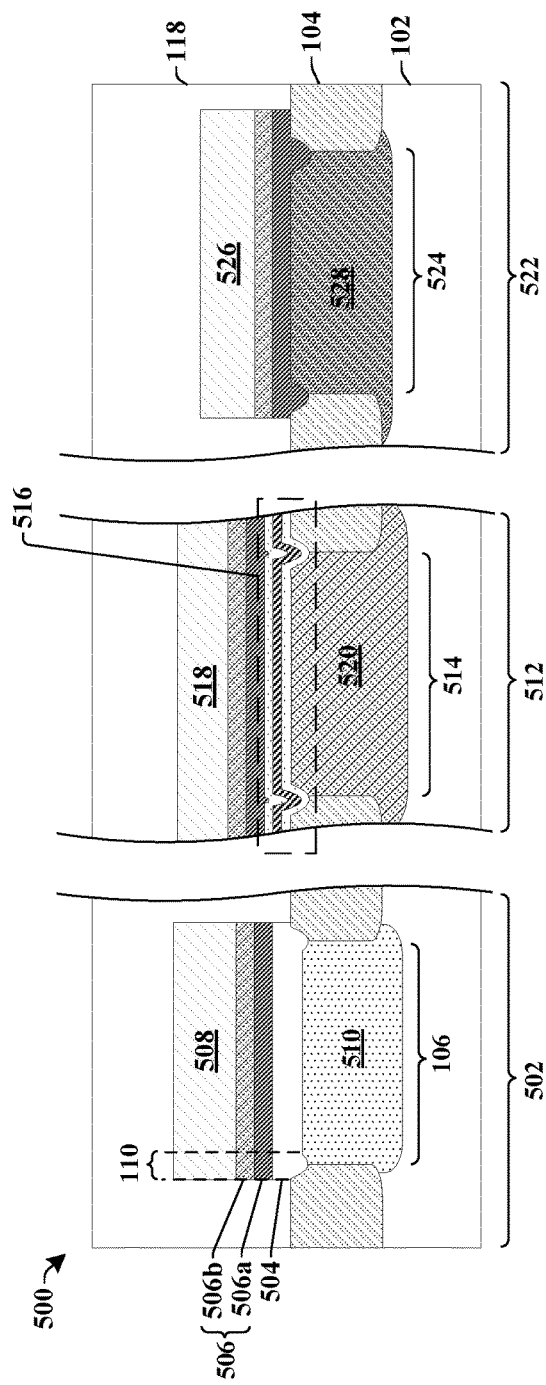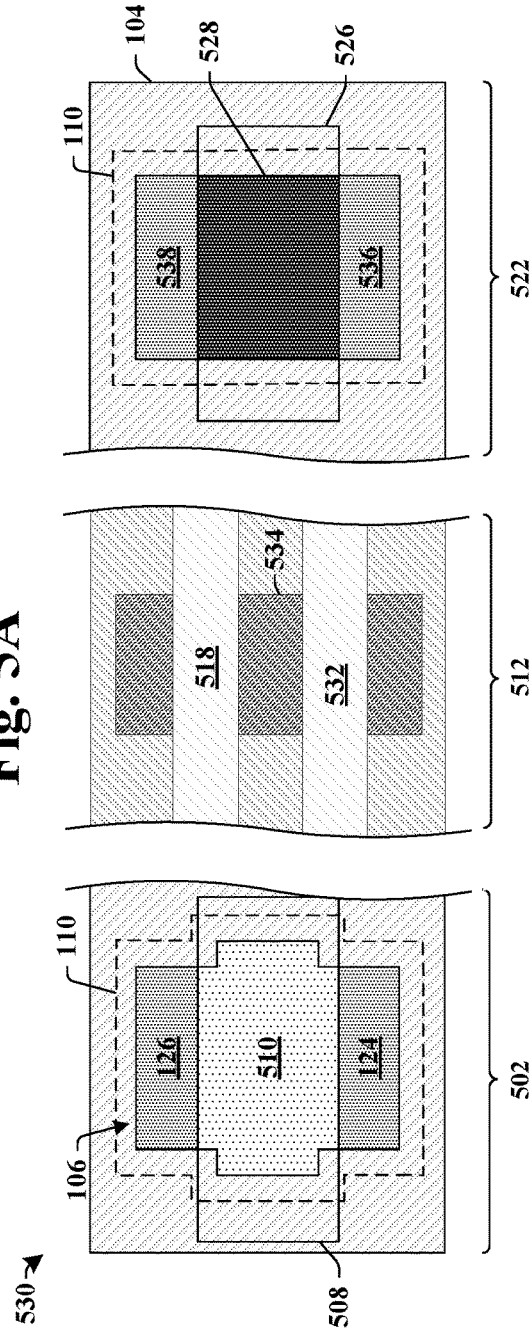
Fig. 5A
Fig. 5B

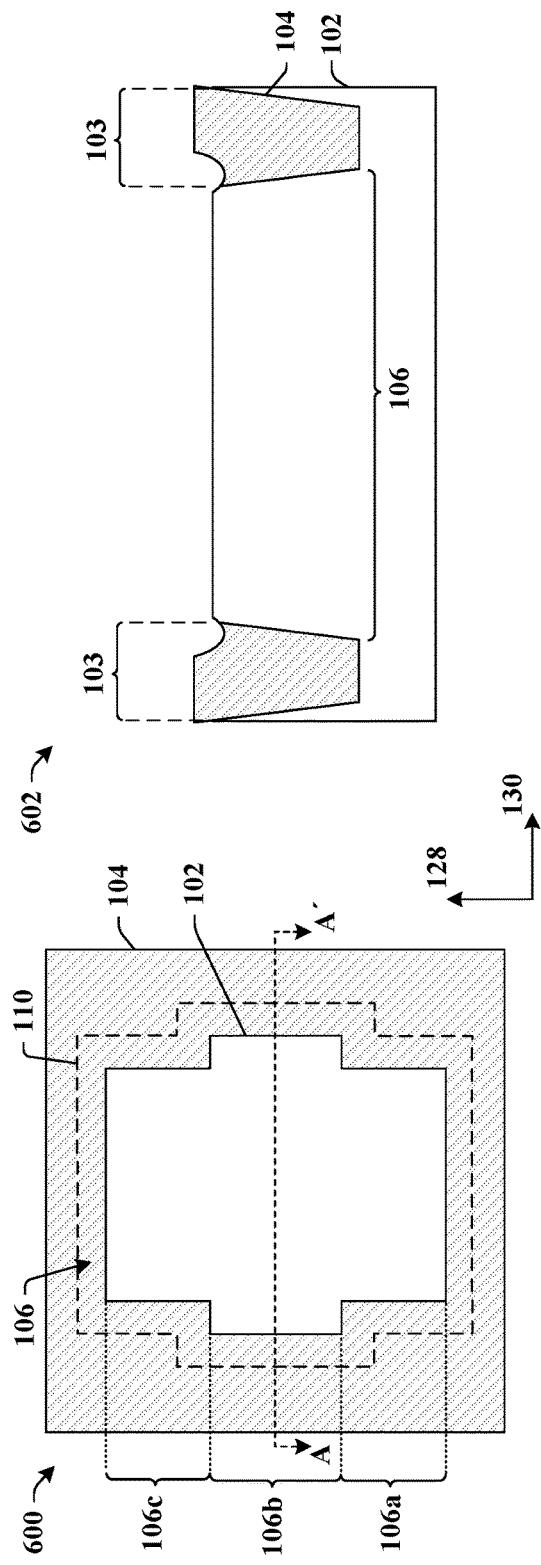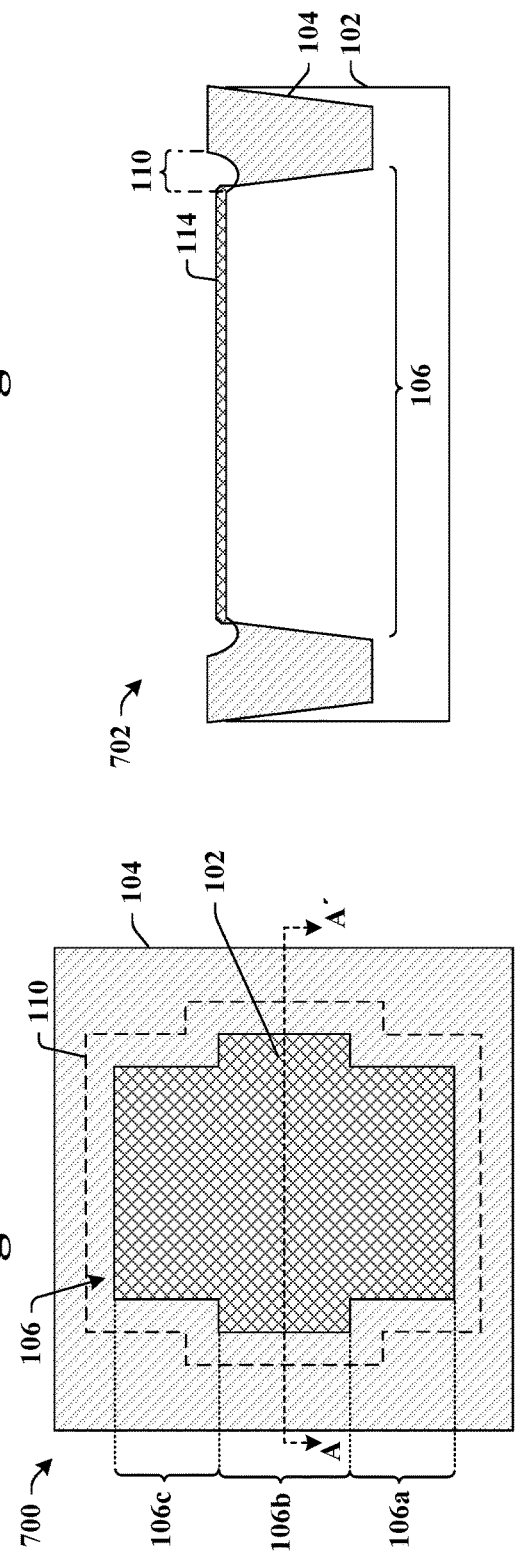

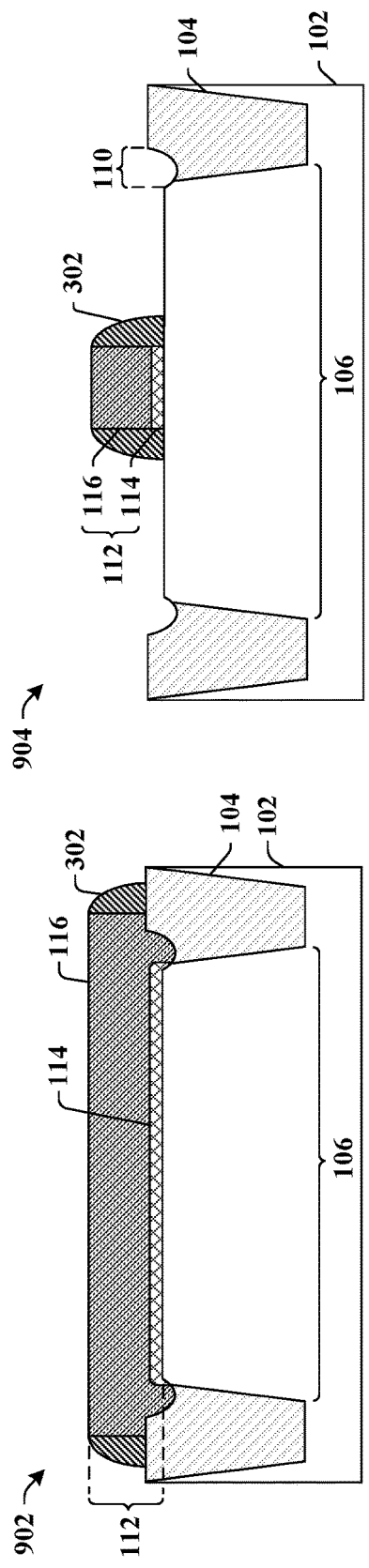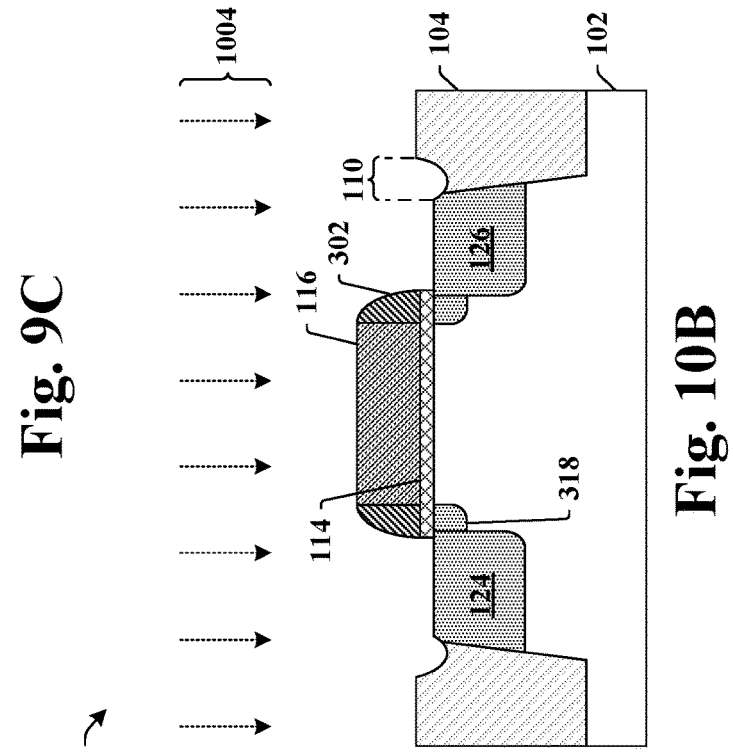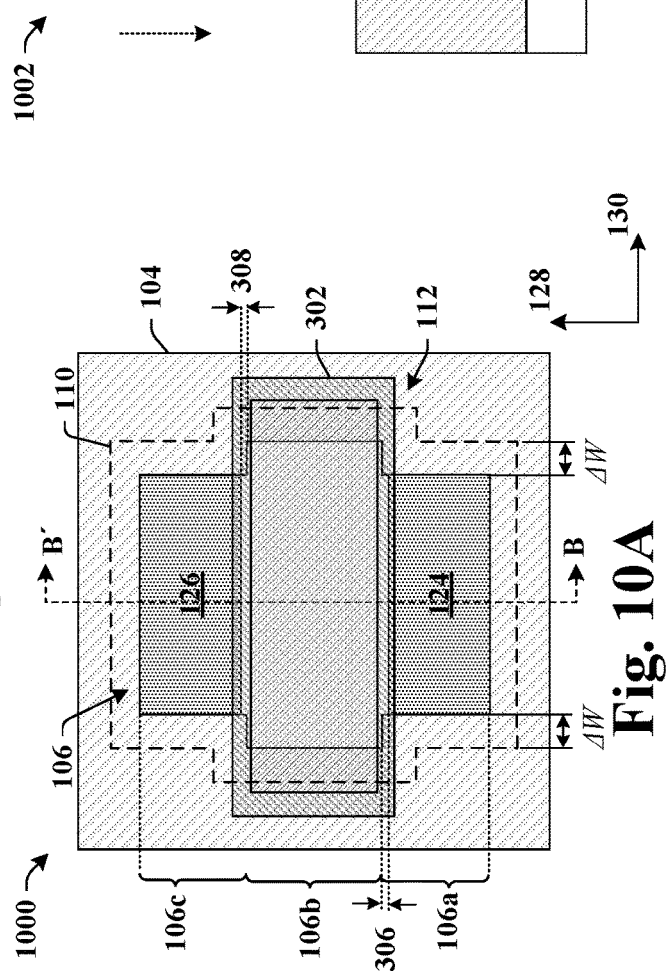

TRANSISTOR LAYOUT TO REDUCE KINK EFFECT

REFERENCE TO RELATED APPLICATIONS

This application is a Continuation of U.S. application Ser. No. 15/989,606, filed on May 25, 2018, which claims the benefit of U.S. Provisional Application No. 62/585,636, filed on Nov. 14, 2017. The contents of the above-referenced patent applications are hereby incorporated by reference in their entirety.

BACKGROUND

Modern day integrated chips comprise millions or billions of semiconductor devices formed on a semiconductor substrate (e.g., a silicon substrate). To improve functionality of integrated chips, the semiconductor industry has continually reduced the dimension of semiconductor devices to provide for integrated chips with small, densely populated devices. By forming integrated chips having small, densely populated devices, the speed of the semiconductor devices increases and the power consumption of the semiconductor devices decreases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5B illustrate some additional embodiments of an integrated chip having different regions with different gate dielectric thicknesses.

FIGS. 6A-11B illustrate some embodiments of cross-sectional views and top-views corresponding to a method of forming an integrated chip comprising a transistor device arranged within an active area having a shape configured to improve device performance.

DETAILED DESCRIPTION

Figure 1A:
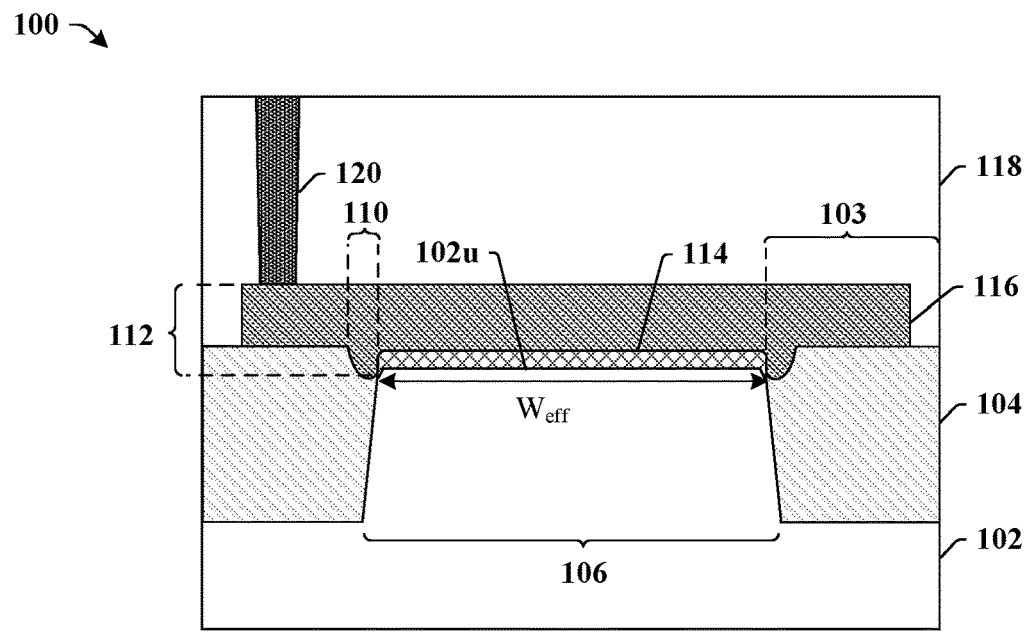
FIGS. 1A-1B illustrate some embodiments of an integrated chip comprising a transistor device within an active area having a shape configured to improved device performance.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In integrated chips, active devices (e.g., MOSFET devices, embedded memory devices, etc.) are generally arranged on a shared semiconductor substrate (e.g., a silicon substrate). However, semiconductor materials can be electrically conductive, such that leakage currents may travel between active devices that are located within a semiconductor substrate in close proximity to one another. If such leakage currents are not properly mitigated, cross-talk between adjacent devices can lead to integrated chip failure.

To prevent leakage currents from traveling between adjacent devices, many modern day integrated chips use shallow trench isolation (STI) structures. Typically, STI structures are formed by forming a pad oxide over a substrate, patterning the pad oxide according to a nitride masking layer, etching trenches in the substrate according to the nitride masking layer, filling the trenches with one or more dielectric materials (such as silicon dioxide or silicon nitride), and removing excess of the one or more dielectric materials from over the substrate. STI formation processes may furthermore use a wet etching process to remove the nitride masking layer and/or the pad oxide used during formation of the STI structures.

However, it has been appreciated that during the formation of an STI structure divots may form within an upper surface of the STI structure (e.g., due to the wet etching process used to remove the nitride masking layer and/or pad oxide). Such divots can negatively impact electrical behavior (e.g., both threshold and sub-threshold voltages) of adjacent devices, leading to unpredictable performance of the devices. For example, during fabrication of a transistor device, a conductive gate material can fill divots within an STI structure, causing the conductive gate material to have sharp edges that can enhance an electric field generated by a gate structure during operation of a transistor device. The enhanced electrical field reduces a threshold voltage of the transistor device, resulting in a problem called the kink effect (e.g., defined by a double hump in a drain current vs. gate voltage relation). The kink effect has a number of negative consequences, such as being difficult to model (e.g., in SPICE curve fitting and/or parameter extraction).

The present disclosure, in some embodiments, relates to a transistor device disposed within an active area having a shape configured to reduce a susceptibility of the transistor device to performance degradation (e.g., the kink effect) caused by divots in an adjacent isolation structure, and an associated method of formation. The transistor device comprises a substrate having interior surfaces defining a trench within an upper surface of the substrate. One or more dielectric materials are arranged within the trench. The one or more dielectric materials define an opening exposing the upper surface of the substrate. The opening has a source opening over a source region within the substrate, a drain opening over a drain region within the substrate, and a channel opening between the source opening and the drain opening. The source opening and the drain opening have widths that are smaller than the channel opening. A gate structure extends over the opening at a location between the source and drain regions. Because the source opening and the drain opening have smaller widths than the channel opening, a resulting channel region extending between the source and drain regions will be separated from edges of the isolation structure by a non-zero distance. Separating the channel region from the edges of the isolation structure by the non-zero distance reduces an effect that divots within the isolation structure have on the channel region.

Figure 1B:
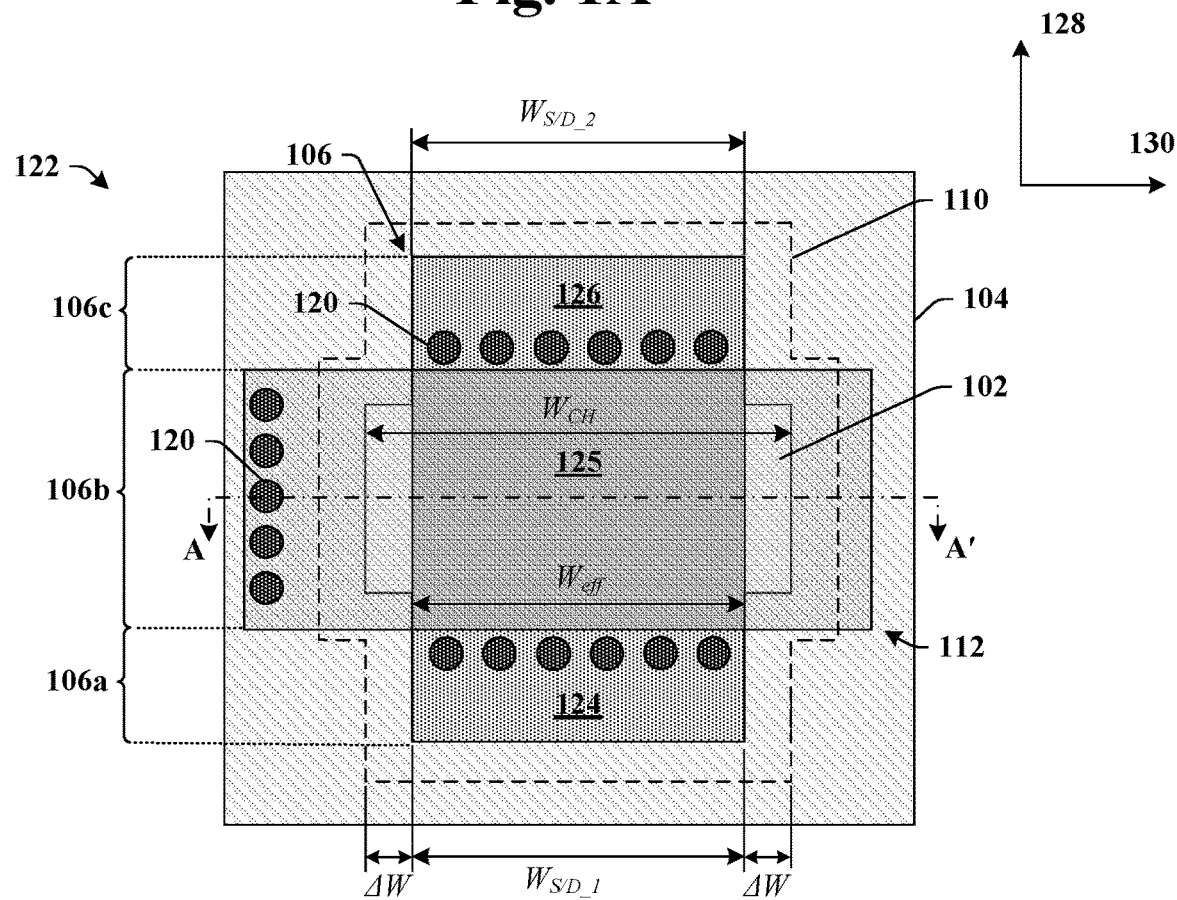

FIGS. 1A-1B illustrate some embodiments of an integrated chip comprising a transistor device within an active area having a shape configured to improved device performance.

As shown in cross-section view 100 FIG. 1A, the integrated chip comprises a substrate 102 having interior surfaces defining a trench 103 extending from an upper surface 102u of the substrate 102 to within the substrate 102. An isolation structure 104 (e.g., a shallow trench isolation (STI) structure) comprising one or more dielectric materials is disposed within the trench 103. The isolation structure 104 comprises sidewalls defining an opening 106 that exposes the upper surface 102u of the substrate 102. The opening 106 defines an active area (i.e., an area of the substrate 102 where a transistor device is located). The isolation structure 104 further comprises surfaces defining one or more divots 110 that are recessed below an uppermost surface of the isolation structure 104. The one or more divots 110 are arranged along an edge of the isolation structure 104 that is proximate to the opening 106.

A gate structure 112 is disposed over the substrate 102 and extends past opposing sidewalls of the isolation structure 104 that define the opening 106. The gate structure 112 comprises a conductive gate material 116 separated from the substrate 102 by a gate dielectric 114. A conductive contact 120 is arranged within a dielectric structure 118 (e.g., an inter-level dielectric (ILD) layer) over the substrate 102. The conductive contact 120 vertically extends from the conductive gate material 116 to a top of the dielectric structure 118.

As shown in the top-view 122 of FIG. 1B, the isolation structure 104 continuously extends around the opening 106 defined by the isolation structure 104 and the one or more divots 110 are arranged within the isolation structure 104 around the opening 106. The opening 106 has a source opening 106a that is separated from a drain opening 106c along a first direction 128 by a channel opening 106b. Along a second direction 130, the source opening 106a has a first width $W_{S/D\_1}$, the drain opening 106c has a second width $W_{S/D\_2}$, and the channel opening 106b has a third width $W_{CH}$ that is larger than the first width $W_{S/D\_1}$ and the second width $W_{S/D\_2}$. In some embodiments, the first width $W_{S/D\_1}$ and the second width $W_{S/D\_2}$ may be substantially equal. In some embodiments, a difference between the first width $W_{S/D\_1}$ and the third width $W_{CH}$ is greater than or equal to approximately twice a width of a first one of the one or more divots 110.

A source region 124 is disposed within the source opening 106a and a drain region 126 is disposed within the drain opening 106c. The source region 124 and the drain region 126 respectively comprise highly doped regions disposed within an upper surface of the substrate 102. In some embodiments, the source region 124 has a width that is substantially equal to the first width $W_{S/D\_1}$ and the drain region 126 has a width that is substantially equal to the second width $W_{S/D\_2}$. In some embodiments, the channel opening 106b extends past opposing sides of the source region 124 and the drain region 126 along the second direction 130. The gate structure 112 extends over the opening 106 at a location between the source region 124 and the drain region 126.

During operation, the conductive gate material 116 is configured to generate an electric field that forms a conductive channel within a channel region 125 extending within the substrate 102 between the source region 124 and the drain region 126. Since the widths of the source region 124 and the drain region 126 are less than the third width $W_{CH}$ of the channel opening 106b, the channel region 125 has an effective width $W_{eff}$ that is separated from the one or more divots 110 within the isolation structure 104 by a non-zero distance ΔW. Separating the effective width $W_{eff}$ of the channel region 125 from the one or more divots 110 within the isolation structure 104 by the non-zero distance ΔW reduces an effect of the one or more divots 110 on the electric field generated by the gate structure 112 along edges of the channel region 125. By reducing an effect of the one or more divots 110 on the channel region 125, a performance of the transistor device is improved (e.g., the kink effect in the drain current caused by the effect of the one or more divots 110 on the electric field generated by the gate structure 112 is reduced).

Figure 2A:
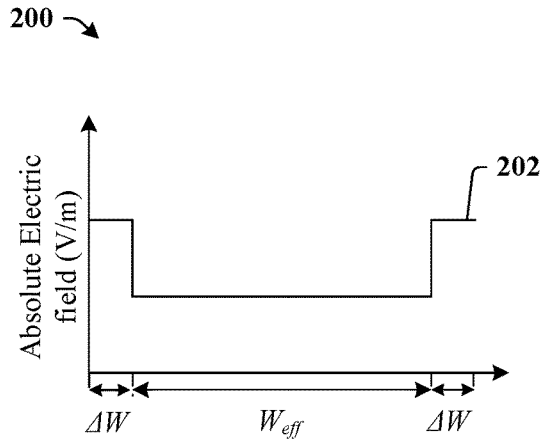
FIGS. 2A-2B illustrate graphs showing some embodiments of exemplary performance parameters of a transistor device having an active area with a disclosed shape.
Figure 2B:
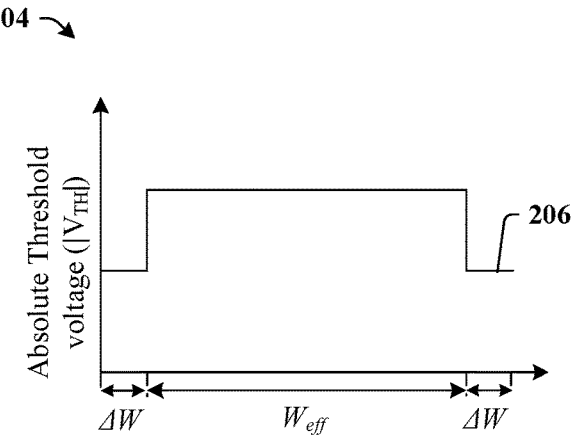

FIGS. 2A-2B illustrate graphs, 200 and 204, showing some embodiments of exemplary performance parameters of the transistor device of FIGS. 1A-1B.

Graph 200 of FIG. 2A illustrates an absolute electric field (shown along the y-axis) as a function of a position within an active area (shown along x-axis). Since a channel region (e.g., 125 of FIG. 1B) formed by a gate structure (e.g., 112 of FIG. 1B) has an effective width $W_{eff}$ that is less than a width of the channel opening (e.g., 106b of FIG. 1B), the channel region is separated on opposing sides from one or more divots (e.g., 110 of FIG. 1B) in the isolation structure by a non-zero distance ΔW.

As shown in graph 200, the absolute electric field within the non-zero distance ΔW is greater than the absolute electric field within the channel region. Therefore, by separating the effective width $W_{eff}$ of the channel region from the isolation structure by the non-zero distance ΔW, the higher absolute electric field caused by the one or more divots is separated from the channel region and an effect of the one or more divots on the absolute electric field 202 generated by the gate structure on the channel region is reduced.

Graph 204 of FIG. 2B illustrates an absolute threshold voltage (shown along the y-axis) as a function of a position within the active area (shown along x-axis). As shown in graph 204, reducing an effect of the absolute electric field on the channel region, reduces a variation of the absolute threshold voltage 206 within the channel region. For example, if the channel region extended to the isolation structure, the absolute electric field along edges of the channel region would decrease an absolute threshold voltage of an associated transistor device. However, because the effective width $W_{eff}$ of the channel region is set back from edges of the channel opening, changes in the absolute threshold voltage within the channel region. Mitigating changes in the absolute threshold voltage in the channel region also reduces the kink effect, and thereby improves performance of the transistor device.

FIGS. 3A-3D illustrates some additional embodiments of an integrated chip comprising a transistor device within an active area having a shape configured to improved device performance.

Figure 3A:
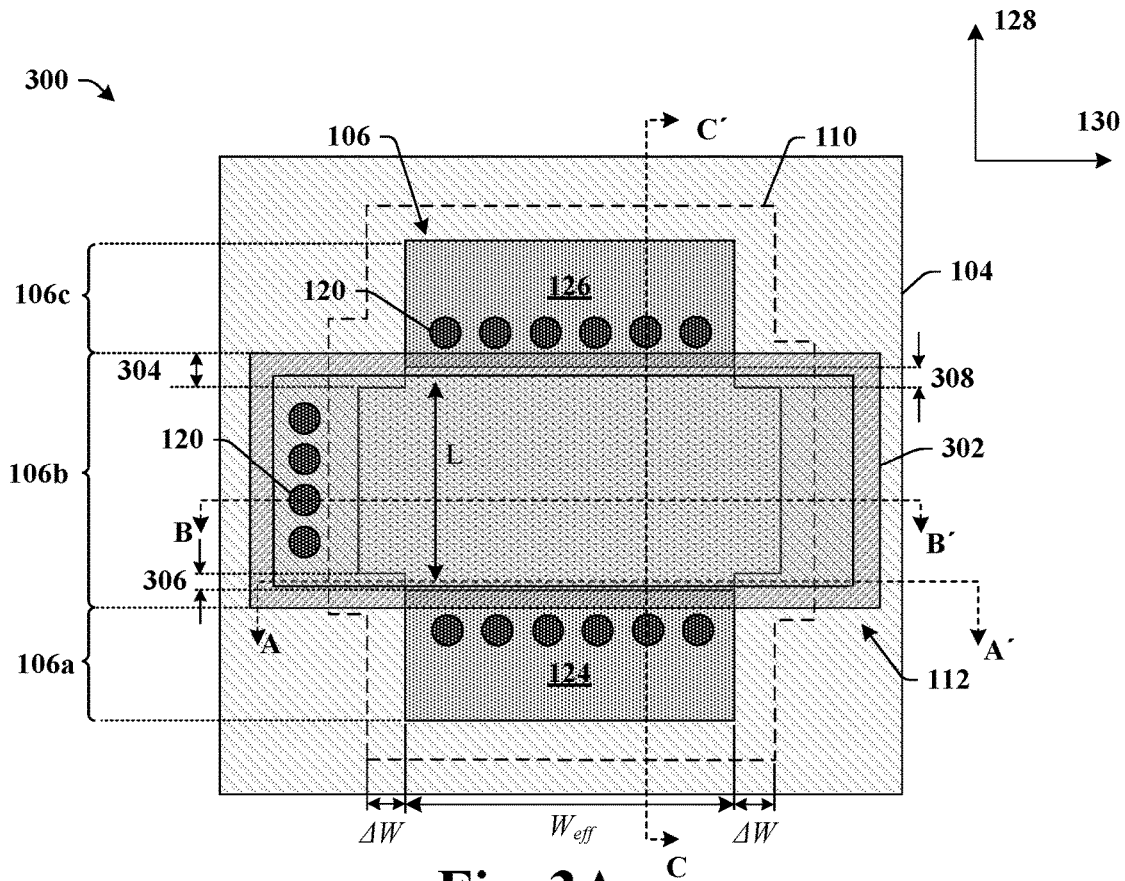
FIGS. 3A-3D illustrates some additional embodiments of an integrated chip comprising a transistor device within an active area having a shape configured to improved device performance.

As shown in top-view 300 of FIG. 3A, the integrated chip has an isolation structure 104 with sidewalls that define an opening 106 over a substrate (102 of FIG. 3B) within an active region having a source region 124 and a drain region 126. The opening 106 comprises a source opening 106a and a drain opening 106c separated along a first direction 128 by a channel opening 106b. The source region 124 has a width (along a second direction 130) that is substantially equal to a width of the source opening 106a and the drain region 126 has a width that is substantially equal to a width of the drain opening 106c. In some embodiments, the opening 106 is substantially symmetric about a line bisecting the source region 124 and the drain region 126. In some alternative embodiments (not shown), the opening 106 may not be symmetric about a line bisecting the source region 124 and the drain region 126. For example, the channel opening 106b may extend a greater distance past a first side of the source opening 106a than past an opposing second side of the source opening 106a.

A gate structure 112 extends over the opening 106 along the second direction 130. The gate structure 112 is arranged between the source region 124 and the drain region 126. In some embodiments, sidewall spacers 302 may be arranged along outer sidewalls of the gate structure 112. The sidewall spacers 302 comprise one or more dielectric materials. For example, in various embodiments, the sidewall spacers 302 may comprise an oxide (e.g., silicon oxide), a nitride (e.g., silicon nitride, silicon oxy-nitride, etc.), a carbide (e.g., silicon carbide), or the like. In some embodiments, the gate structure 112 and/or the sidewall spacers 302 may extend along the first direction 128 past opposing sides of the channel opening 106b by a first non-zero distance 304. In some embodiments, the source region 124 is set back from a boundary between the source opening 106a and the channel opening 106b by a second non-zero distance 306, while the drain region 126 is set back from a boundary between the drain opening 106c and the channel opening 106b by a third non-zero distance 308.

In some embodiments, the first non-zero distance 304 is greater than the second non-zero distance 306 and the third non-zero distance 308. In some such embodiments, the source region 124 and the drain region 126 may extend to below the sidewall spacers 302. In some embodiments, the opening 106 may change from a first width within the source opening 106a to a second width within the channel opening 106b at a location that is directly under the sidewall spacers 302. Similarly, the opening 106 may transition from a second width within the channel opening 106b to a third width within the drain opening 106c at a location that is directly under the sidewall spacers 302. In other embodiments (not shown), the opening 106 may transition between widths at a location below the gate structure 112.

Figure 3B:
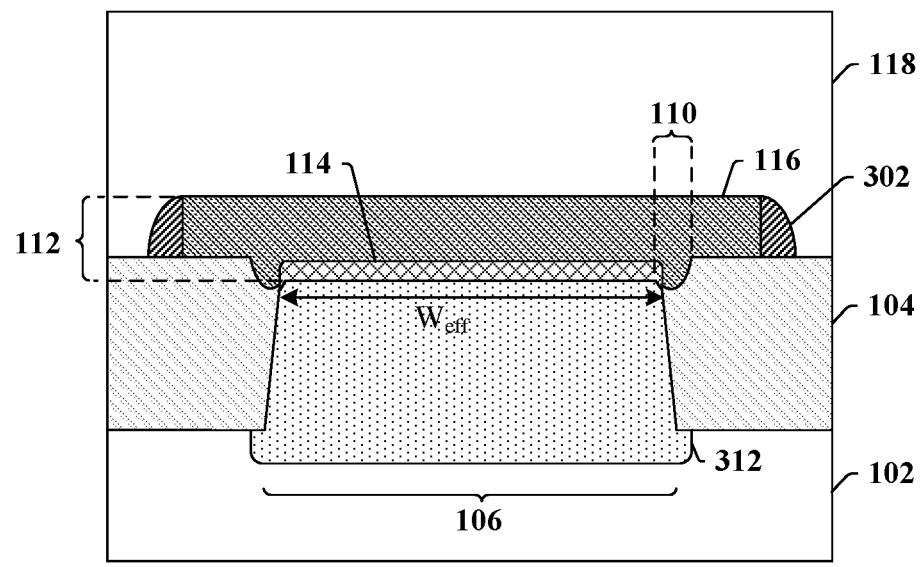
Figure 3C:
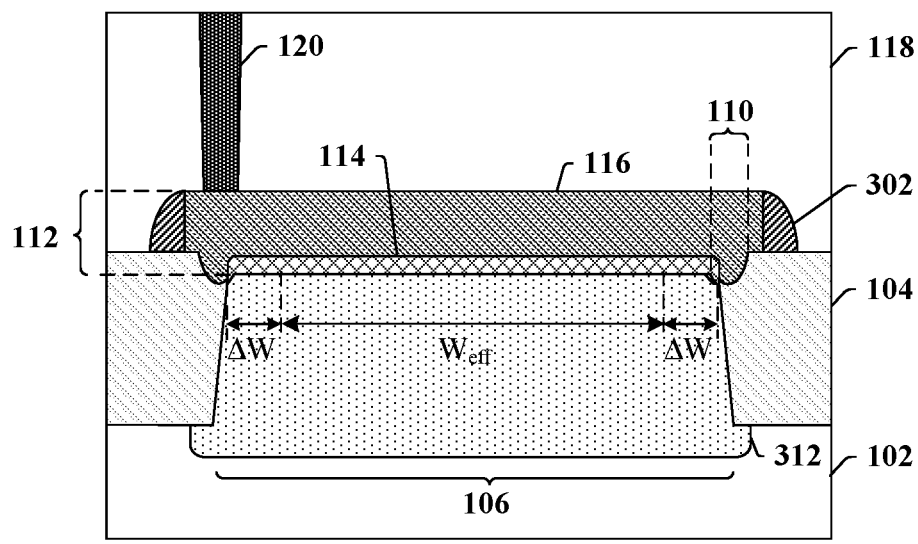

FIGS. 3B-3C illustrate cross-sectional views, 310 and 314, of the integrated chip along cross-sectional lines A-A' and B-B'. As shown in cross-sectional view 310 of FIG. 3B, along cross-sectional line A-A' the opening 106 has a first width that is substantially equal to an effective width $W_{eff}$ of a channel region between the source region 124 and the drain region 126. As shown in cross-sectional view 314 of FIG. 3C, along cross-sectional line B-B' the opening 106 has a second width of $W_{eff}+2\Delta W$, which is greater than the first width by a distance that is equal to twice a non-zero distance $\Delta W$ (i.e., $2\Delta W$).

In some embodiments, a size of the non-zero distance $\Delta W$ may be in a range of between approximately 2% and approximately 10% of a size of the effective width $W_{eff}$. For example, in some embodiments, the non-zero distance $\Delta W$ may have a size of between approximately 10 nm and approximately 1,000 nm, while the effective width $W_{eff}$ may have a size of between approximately 100 nm and approximately 50,000 nm. Having the non-zero distance $\Delta W$ greater than approximately 2% of the effective width $W_{eff}$ provides for a large enough distance between the divot and the channel region so as to decrease an impact of electric field changes caused by the one or more divot 110 on the channel region. Having the non-zero distance $\Delta W$ less than 10% of the effective width $W_{eff}$ keeps a footprint of the transistor device small enough to be cost effective.

In some embodiments, a well region 312 may be disposed within the substrate 102 below the opening 106. The well region 312 has a doping type that is different than that of the substrate 102. For example, in some embodiments where the transistor device is an NMOS transistor, the substrate 102 may have an n-type doping, the well region 312 may have a p-type doping, and the source region 124 and the drain region 126 may have the n-type doping. In other embodiments, where the transistor device is a PMOS transistor, the substrate 102 may have an n-type doping, the well region 312 may have the n-type doping, and the source region 124 and the drain region 126 may have the p-type doping.

A dielectric structure 118 (e.g., an inter-level dielectric (ILD) layer) is arranged over the substrate 102. In some embodiments, the dielectric structure 118 may comprise borophosphosilicate glass (BPSG), borosilicate glass (BSG), phosphosilicate glass (PSG), or the like. A conductive contact 120 vertically extends through the dielectric structure 118 to the conductive gate material 116. The conductive contact 120 may comprise tungsten, copper, aluminum copper, or some other conductive material.

Figure 3D:
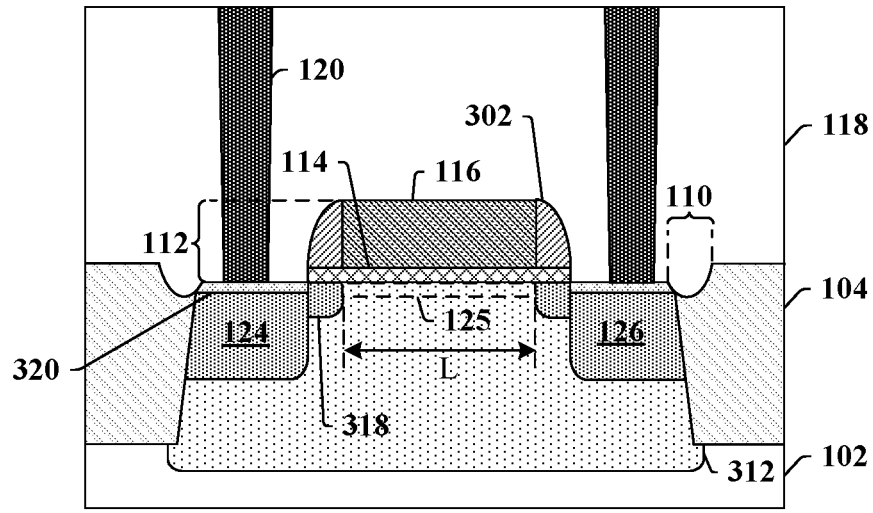

FIG. 3D illustrates a cross-sectional view 316 of the integrated chip along cross-sectional line C-C' of FIG. 3A. As shown in cross-sectional view 316, the source region 124 and the drain region 126 arranged within the well region 312 on opposing sides of the conductive gate material 116.

The channel region 125 has a length L. In some embodiments, the length L of the channel region 125 is approximately equal to a width of the gate structure 112. In other embodiments, the length L of the channel region 125 is less than a width of the gate structure 112. In some embodiments, source and drain extension regions 318 may protrude outward from the source region 124 and the drain region 126 to below the sidewall spacers 302 and/or the conductive gate material 116. In such embodiments, the channel region 125 extends between the source and drain extension regions 318. In some embodiments, a silicide layer 320 may be arranged on the source region 124 and the drain region 126. In some embodiments, the silicide layer 320 may comprise a nickel silicide, cobalt silicide, titanium silicide, or the like.

Figure 4:
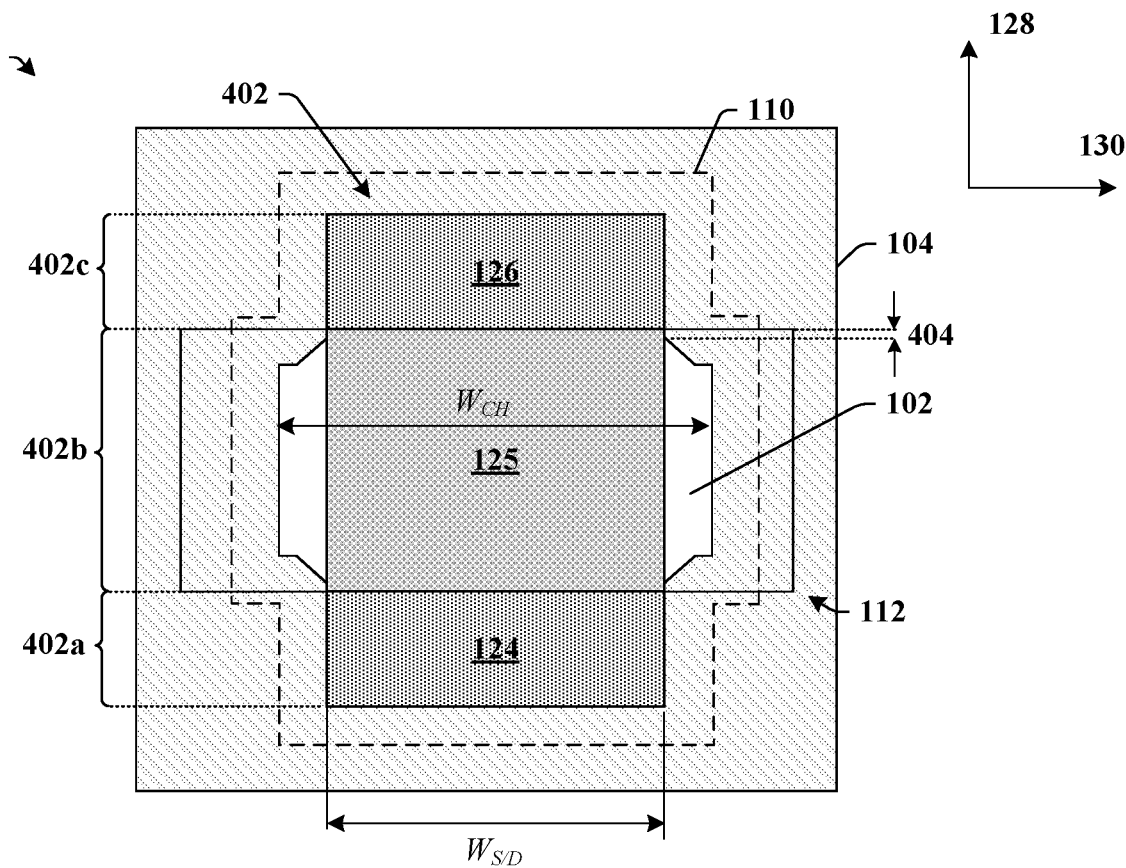
FIG. 4 illustrates a top-view showing some alternative embodiments of an integrated chip comprising a transistor device within an active area having a shape configured to improve device performance.

Although FIG. 3A illustrates the opening 106 as having rectangular shaped source, drain and channel openings, it will be appreciated that the opening may have alternative shapes that form a channel region that is set back from sides of an isolation structure defining the opening. For example, FIG. 4 illustrates a top-view showing some alternative embodiments of an integrated chip 400 having a transistor device with isolation structures configured to improve device performance.

The integrated chip 400 comprises an isolation structure 104 defining an opening 402 exposing the substrate 102. The opening 402 defined by the isolation structure 104 has a source region 124 within a source opening 402a and a drain region 126 within a drain opening 402c. The source opening 402a and the drain opening 402c are separated by a channel opening 402b. The channel opening 402b has a width that gradually changes from the first width $W_{S/D}$ to a second width $W_{CH}$. In some embodiments, the isolation structure 104 has angled sidewalls that define the channel opening 402b and that gradually increase a width of the channel opening 402b in a linear manner. Gradually increasing a width of the channel opening 402b in a linear manner allows for a distance between a channel region and the one or more divots 110 to be kept relatively large in spite of alignment errors. For example, if the gate structure 112 is misaligned along a first direction 128, the size of the source region 124 or the drain region 126 along a second direction 128 is limited by the gradual increase in the width of the channel opening 402b, thereby keeping the channel region from away from the divots along edges of the channel opening 402b. In some embodiments, the angled sidewalls are set back from an outer edge of the gate structure 112 by a non-zero distance 404. In other embodiments (not shown), the isolation structure 104 may have curved sidewalls (viewed from a top-view) that define the channel opening 402b. For example, the isolation structure 104 may have sidewalls that have a slope (viewed from a top-view) with an absolute value that increases as a distance from the source region 124 or the drain region 126 decreases.

FIGS. 5A-5B illustrate some additional embodiments of an integrated chip having different regions with different gate dielectric thicknesses. It has been appreciated that the formation of multiple gate dielectric layers within different regions of an integrated chip may increase a size of divots within isolation structures due to the additional etch processes, thereby aggravating the kink effect within associated transistor devices. For example, in some processes used to form multiple gate dielectric layers, a gate oxide may be thermally grown on a substrate (but not on surrounding isolation structures). The gate oxide may be subsequently removed from the substrate in some device regions that use a different gate dielectric layer. Removal of the gate oxide is done by an etch that also acts on the surrounding isolation structures. Due to over etching, the removal of the gate oxide may increase a size of divots within the isolation structures.

The integrated chip comprises a substrate 102 having a first logic region 502, an embedded memory region 512, and a second logic region 522. Isolation structures 104 are arranged within the substrate 102 within the first logic region 502, the embedded memory region 512, and the second logic region 522. In some embodiments, the first logic region 502 comprises a high voltage transistor device that is configured to provide a higher breakdown voltage than a dual gate transistor device arranged within the second logic region 522.

As shown in cross-sectional view 500 of FIG. 5A, the isolation structure 104 within the first logic region 502 has sidewalls defining an opening 106 exposing a first upper surface of the substrate 102. A high voltage gate electrode 508 is arranged over the opening 106 and is vertically separated from a substrate 102 by way of a high voltage gate dielectric layer 504 and a dual-gate dielectric layer 506 having a first gate dielectric layer 506a and a second gate dielectric layer 506b. In some embodiments, the high voltage gate electrode 508 is vertically separated from a high voltage well 510 disposed within the substrate 102. In some embodiments, the substrate 102 may have a first doping type and the high voltage well 510 may have a second doping type. As shown in top-view 530 of FIG. 5B, the opening 106 in the first logic region 502 is larger below the high voltage gate electrode 508 than within a source region 124 or a drain region 126.

As shown in cross-sectional view 500 of FIG. 5A, the isolation structure 104 within the embedded memory region 512 has sidewalls defining an opening 514 exposing a second upper surface of the substrate 102. In some embodiments, a control gate electrode 518 is arranged over the opening 514 and is separated from the substrate 102 by the dual-gate dielectric layer 506 and a charge trapping dielectric structure 516. In some embodiments, the charge trapping dielectric structure 516 may comprise an ONO structure having a nitride layer disposed between a first oxide layer and a second oxide layer. In some embodiments, the control gate electrode 518 is vertically separated from a control well 520 disposed within the substrate 102. As shown in top-view 530 of FIG. 5B, the embedded memory region 512 may also comprise a select gate electrode 532. In some embodiments, the control gate electrode 518 and the select gate electrode 532 share a common source/drain region 534. Although the embedded memory region 512 of FIGS. 5A-5B is illustrated as comprising a SONOS flash memory device, it will be appreciated that in other embodiments, the embedded memory region 512 may comprise different types of memory devices. For example, in other embodiments, the embedded memory region 512 may comprise a different type of flash memory device, such as a floating gate flash memory device, a split gate flash memory device, etc.), or the like.

As shown in cross-sectional view 500 of FIG. 5A, the isolation structure 104 within the second logic region 522 has sidewalls defining an opening 524 exposing a third upper surface of the substrate 102. A logic gate electrode 526 is vertically separated from the substrate 102 by the dual gate dielectric layer 506. In some embodiments, the logic gate electrode 526 is vertically separated from a logic well 528 disposed within the substrate 102. As shown in top-view 530 of FIG. 5B, the logic gate electrode 526 extends between a source region 536 and a drain region 538 arranged within the opening 524 within the second logic region 522. In some embodiments, the opening 524 within the second logic region 522 may be substantially rectangular. In other embodiments (not shown), the opening 524 within the second logic region 522 may have a greater width below the logic gate electrode 526 than around the source region 536 and/or the drain region 538.

FIGS. 6A-11B illustrate some embodiments of cross-sectional views and top-views corresponding to a method of forming an integrated chip comprising a transistor device arranged within an active area having a shape configured to improve device performance. By using the shape of the active area to improve device performance, the method is able to be performed at a low cost since it does not require additional masks and/or processing steps. Furthermore, it is compatible with existing process flows. Although FIGS. 6A-11B are described with reference to a method, it will be appreciated that the structures shown in FIGS. 6A-11B are not limited to the method but rather may stand alone separate of the method.

As shown in top-view 600 of FIG. 6A and cross-sectional view 602 of FIG. 6B, an isolation structure 104 is formed within a trench 103 within a substrate 102. The isolation structure 104 has sidewalls that define an opening 106 that exposes an upper surface 102u of the substrate 102. As shown in top-view 600 of FIG. 6A, the opening 106 has a source opening 106a, a drain opening 106c, and a channel opening 106b. The channel opening 106b is arranged between the source opening 106a and the drain opening 106c along a first direction 128. The source opening 106a and the drain opening 106c have smaller widths than the channel opening 106b along a second direction 130 that is perpendicular to the first direction 128. As shown in cross-sectional view 602 of FIG. 6B, the trench 103 defined by interior surfaces of the substrate 102. During formation of the isolation structures 104, one or more divots 110 may be formed within a top of the isolation structure 104. The one or more divots 110 may be arranged along an edge of the isolation structure 104 that is proximate to the opening 106.

In some embodiments, the isolation structure 104 may be formed by selectively etching the substrate 102 to form the trench 103. One or more dielectric materials are subsequently formed within the trench 103. In various embodiments, the substrate 102 may be selectively etched by a wet etchant (e.g., hydrofluoric acid, potassium hydroxide, or the like) or a dry etchant (e.g., having an etching chemistry comprising fluorine, chlorine, or the like). In various embodiments, the substrate 102 may be any type of semiconductor body (e.g., silicon, SiGe, SOI, etc.), as well as any other type of semiconductor, epitaxial, dielectric, or metal layers, associated therewith. In various embodiments, the one or more dielectric materials may comprise an oxide, a nitride, a carbide, or the like.

In some additional embodiments, the isolation structure 104 may be formed by using a thermal process to form a pad oxide over the substrate 102, followed by the formation of a nitride film over the pad oxide. The nitride film is subsequently patterned (e.g., using a photosensitive material, such as photoresist), and the pad oxide and substrate 102 are patterned according to the nitride film to form the trench 103 within the substrate 102. The trench 103 is then filled with one or more dielectric materials, followed by a planarization process (e.g., a chemical mechanical planarization process) to expose a top of the nitride film and an etch to remove the nitride film.

As shown in top-view 700 of FIG. 7A and cross-sectional view 702 of FIG. 7B, a gate dielectric 114 is formed over the substrate 102 and within the opening 106. In some embodiments, the gate dielectric 114 may comprise an oxide (e.g., silicon oxide), a nitride (e.g., silicon oxy-nitride), or the like. In some embodiments, the gate dielectric 114 may be formed by way of a vapor deposition technique (e.g., PVD, CVD, PE-CVD, ALD, etc.). In other embodiments, the gate dielectric 114 may be formed by way of a thermal growth process. In some embodiments, an implantation process may be performed prior to the formation of the gate dielectric 114 to form a well region (not shown) in the substrate 102. In some such embodiments, a sacrificial dielectric layer (not shown) may be formed over the substrate 102 prior to the implantation process to regulate a depth of the well region. The sacrificial dielectric layer is subsequently removed prior to formation of the gate dielectric.

In some embodiments, the gate dielectric 114 may be formed as part of a multiple gate dielectric process, in which different gate dielectric layers are formed within different regions of the substrate 102. For example, in some embodiments, the multiple gate dielectric process may form a high voltage gate dielectric layer (e.g., by a thermal process) over a high voltage well within the substrate 102. The high voltage gate dielectric layer may be subsequently removed from one or more regions of a chip (e.g., within an embedded memory region), and a dual-gate dielectric layer may be formed over a logic well within the substrate 102 (e.g., by one or more deposition processes). It has been appreciated that the formation of multiple gate dielectric layers may increase a size of the one or more divots 110 within the isolation structures 104 due to the additional etch processes that are performed to remove the gate dielectric layers from different regions of the substrate, thereby aggravating the kink effect within associated transistor devices.

Figure 8B:
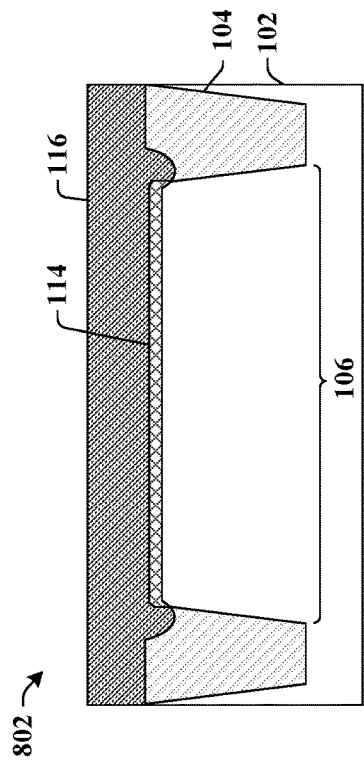
Figure 8A:
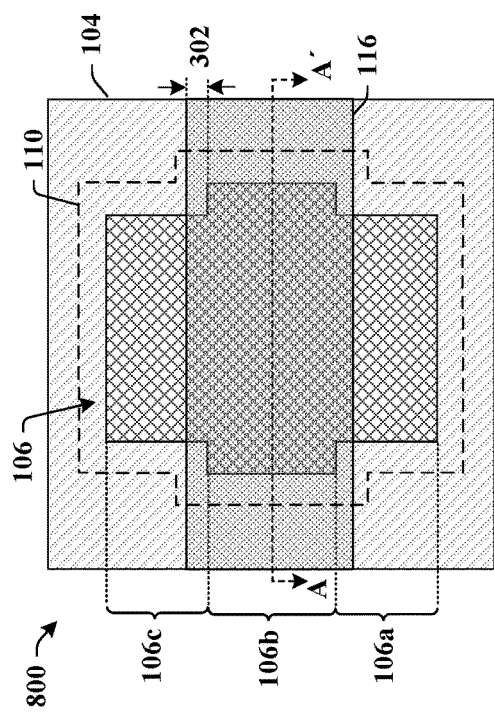

As shown in top-view 800 of FIG. 8A and cross-sectional view 802 of FIG. 8B, a conductive gate material 116 is formed over the gate dielectric 114 and within the divots in the isolation structure 104. The conductive gate material 116 may be formed by way of a deposition process (e.g., CVD, PE-CVD, PVD, or ALD). In some embodiments, the conductive gate material 116 may comprise doped polysilicon. In some embodiments (not shown), the conductive gate material 116 may comprise a sacrificial gate material that is subsequently replaced with a metal gate material, such as aluminum, cobalt, ruthenium, or the like.

Figure 9A:
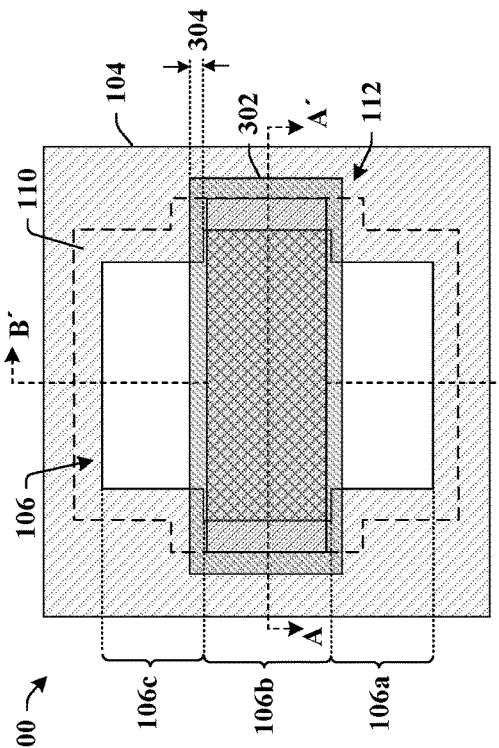

As shown in top-view 900 of FIG. 9A and cross-sectional views 902 and 904 of FIGS. 9B-9C (respectively along cross-sectional lines A-A' and B-B'), the gate dielectric 114 and the conductive gate material 116 are patterned to define a gate structure 112 extending over the opening 106 and over the isolation structure 104. The gate structure 112 may fill the one or more divots 110 within the upper surface of the isolation structure 104.

The gate dielectric 114 and the conductive gate material 116 may be selectively patterned according to a masking layer (not shown) formed over the conductive gate material 116. In some embodiments, the masking layer may comprise a photosensitive material (e.g., photoresist) formed by a spin coating process. In such embodiments, the layer of photosensitive material is selectively exposed to electromagnetic radiation according to a photomask. The electromagnetic radiation modifies a solubility of exposed regions within the photosensitive material to define soluble regions. The photosensitive material is subsequently developed to define openings within the photosensitive material by removing the soluble regions. In other embodiments, the masking layer may comprise a hard mask layer (e.g., a silicon nitride layer, a silicon carbide layer, or the like).

In some embodiments, one or more sidewall spacers 302 are formed on opposing sides of the gate structure 112. In some embodiments, the one or more sidewall spacers 302 may be formed by depositing a spacer material (e.g., a nitride or an oxide) onto horizontal and vertical surfaces of the gate structure 112, and subsequently etching the spacer material to remove the spacer material from the horizontal surfaces to form the one or more sidewall spacers 302. In some embodiments, the gate structure 112 and/or the sidewall spacers 302 may extend past opposing sides of the channel opening 106b by a first non-zero distance 304.

As shown in top-view 1000 of FIG. 10A and cross-sectional views 1002 of FIG. 10B, a source region 124 and a drain region 126 are formed within the substrate 102 on opposing sides of the gate structure 112 along a first direction 128. The source region 124 comprises a first doping type (e.g., an n-type doping) that is different than a second doping type (e.g., a p-type doping) surrounding the source region 124. For example, the source region 124 may comprise a first doping type within a substrate 102 or well region (not shown) having a second doping type. In some embodiments, the source region 124 is set back from a boundary between the source opening 106a and the channel opening 106b by a second non-zero distance 306 and the drain region 126 is set back from a boundary between the drain opening 106c and the channel opening 106b by a third non-zero distance 308. By setting the source region 124 and the drain region 126 back from the channel opening 106b (along the first direction 128), the source region 124 and the drain region 126 have widths that are less than a width of the channel opening 106b. The smaller widths of the source region 124 and the drain region 126 cause the source region 124 and the drain region 126 to also be set back from sidewalls of the isolation structure 104 defining the channel opening 106b by a non-zero distance ΔW along a second direction 130 that is substantially perpendicular to the first direction 128. Setting the source region 124 and the drain region 126 back from sidewalls of the isolation structure 104 separates a channel region (between the source region 124 and the drain region 126) from the one or more divots 110 within the isolation structure 104, and thereby decreases an effect the one or more divots 110 have on an electric field generated by the gate structure 112 within the channel region. In some embodiments, the source region 124 and the drain region 126 may be formed by an implantation process. The implantation process may be performed by selectively implanting a dopant species 1004 into the substrate 102 according to a mask comprising the conductive gate material 116 and the sidewall spacers 302. In various embodiments, the dopant species 1004 may comprise a p-type dopant (e.g., boron, gallium, etc.) or an n-type dopant (e.g., phosphorus, arsenic, etc.). In some embodiments, after implanting the dopant species 1004 into the substrate 102, a drive-in anneal may be performed to diffuse the dopant species 1004 within the substrate 102. In some embodiments, one or more addition implantation processes may be performed to form source and drain extension regions 318 within the substrate. In such embodiments, the one or more addition implantation processes may comprise angled implantation processes so that the source and drain extension regions 318 extend below the gate structure 112.

Figure 11B:
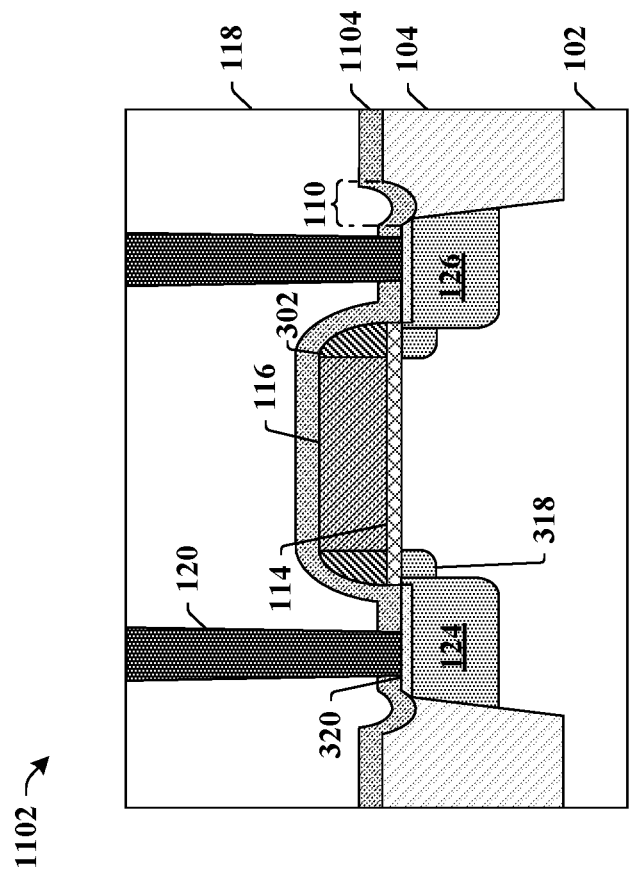
Figure 11A:
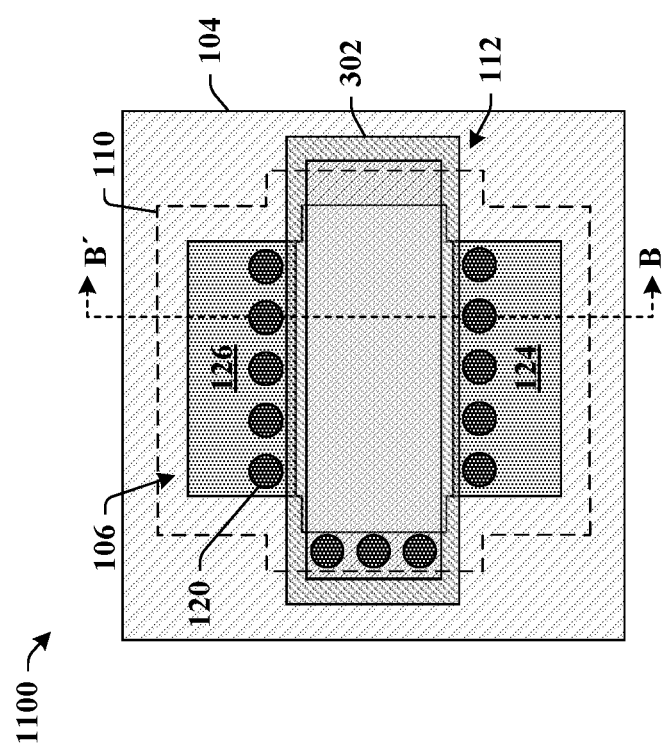

As shown in top-view 1100 of FIG. 11A and cross-sectional view 1102 of FIG. 11B, a dielectric structure 118 (e.g., an inter-level dielectric (ILD) layer) is formed over the substrate 102. The dielectric structure 118 may comprise an oxide, PSG, a low κ dielectric, or some other dielectric, and may be formed by vapor deposition process (e.g., CVD, PE-CVD, PVD, or ALD). A conductive contact 120 is formed within the dielectric structure 118. The conductive contact 120 may extend from a top surface of the dielectric structure 118 to the conductive gate material 116, the source region 124, or the drain region 126. In some embodiments, the dielectric structure 118 may be formed by selectively etching the dielectric structure 118 to form an opening. The opening is subsequently filled with a conductive material. In some embodiments, a planarization process (e.g., a chemical mechanical polishing process) may be performed after filling the opening with the conductive material to co-planarize upper surfaces of the dielectric structure 118 and the conductive contact 120. In various embodiments, the conductive material may comprise tungsten, copper, aluminum copper, or some other conductive material.

A contact etch stop layer 1104 may be formed over the substrate 102 prior to the formation of the dielectric structure 118. In various embodiments, the contact etch stop layer 1104 may comprise an oxide, a nitride, a carbide, or the like. In some embodiments, wherein the conductive gate material 116 comprises polysilicon, the contact etch stop layer 1104 may extend over an upper surface of the conductive gate material 116. In other embodiments (not shown), wherein the conductive gate material 116 comprises a metal gate (e.g., an aluminum gate), the contact etch stop layer 1104 may not extend over the upper surface of the conductive gate material 116. For example, during the formation of a conductive gate material 116 comprising a metal gate, a sacrificial gate structure may formed over the substrate 102 followed by the formation of a contact etch stop layer and a first ILD layer. A first CMP process is subsequently performed to expose a top of the sacrificial gate structure by removing the contact etch stop layer and the ILD layer from over the sacrificial gate structure. The sacrificial gate structure is then removed and replaced with a metal gate followed by a second CMP process and subsequent formation of a contact within a second ILD layer over the first ILD layer.

Figure 12:
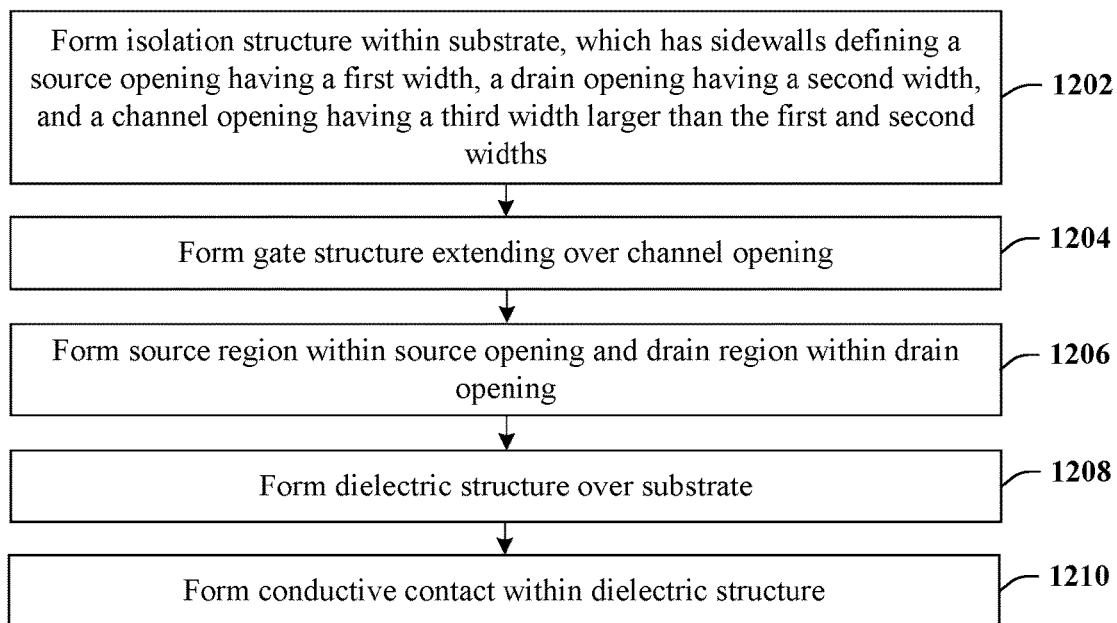
FIG. 12 illustrates a flow diagram of some embodiments of a method of forming an integrated chip comprising a transistor device arranged within an active area having a shape configured to improve device performance.

FIG. 12 illustrates a flow diagram of some embodiments of a method 1200 of forming an integrated chip comprising a transistor device arranged within an active area having a shape configured to improve device performance.

While the disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1202, an isolation structure is formed within a substrate. The isolation structure comprises sidewalls defining an active area having a source opening with a first width, a drain opening with a second width, and a channel opening with a third width larger than the first and second widths. The isolation structure also comprises surfaces defining one or more divots recessed below an uppermost surface of the isolation structure. FIGS. 6A-6B illustrate some embodiments corresponding to act 1202.

At 1204, a gate structure is formed to extend over the channel opening. FIGS. 7A-9C illustrate some embodiments corresponding to act 1204.

At 1206, source and drain regions are formed within the source opening and the drain opening. FIGS. 10A-10B illustrate some embodiments corresponding to act 1206.

At 1208, a dielectric structure is formed over the substrate. FIGS. 11A-11B illustrate some embodiments corresponding to act 1208.

At 1210, a conductive contact is formed within the dielectric structure. FIGS. 11A-11B illustrate some embodiments corresponding to act 1210.

Accordingly, in some embodiments, the present disclosure relates to a transistor device within an active area having a shape configured to reduce a susceptibility of a transistor device to the kink effect caused by divots in an isolation structure, and an associated method of formation.

In some embodiments, the present disclosure relates to an integrated chip. The integrated chip includes a substrate having interior surfaces that define a trench within an upper surface of the substrate; an isolation structure including one or more dielectric materials within the trench and having sidewalls that define an opening exposing the upper surface of the substrate, the opening has a source opening with a first width, a drain opening with a second width, and a channel opening with a third width larger than the first width and the second width; a source region disposed within the substrate within the source opening; a drain region disposed within the substrate within the drain opening; and a gate structure extending over the opening at a location between the source region and the drain region. In some embodiments, the isolation structure has surfaces defining a one or more divots recessed below an uppermost surface of the isolation structure along an edge of the isolation structure that is proximate to the opening. In some embodiments, the source region is separated from the drain region along a first direction; a first one of the one or more divots comprises a first segment extending within the isolation structure along the first direction and a second segment extending within the isolation structure along a second direction that is perpendicular to the first direction; and a line extending along a boundary between the source opening and the drain opening intersects the second segment. In some embodiments, a difference between the first width and the third width is greater than or equal to approximately twice a width of a first one of the one or more divots. In some embodiments, the gate structure is configured to generate a channel region that extends within the substrate between the source region and the drain region; and opposing edges of the channel region are separated from the isolation structure by a non-zero distance. In some embodiments, the channel opening extends past the source opening and the drain opening in opposite directions. In some embodiments, the integrated chip further includes sidewall spacers arranged along outer sidewalls of the gate structure, the opening transitions between the first width and the third width at a position that is directly below the sidewall spacers. In some embodiments, the gate structure straddles the channel opening along a first direction and along a second direction that is perpendicular to the first direction. In some embodiments, the source region is separated from the channel opening by a first non-zero distance and the drain region is separated from the channel opening by a second non-zero distance. In some embodiments, the opening is substantially symmetric about a line bisecting the source region and the drain region. In some embodiments, the first width is substantially equal to the second width. In some embodiments, the opening transitions between the first width and the third width at a position that is directly below the gate structure.

In other embodiments, the present disclosure relates to an integrated chip. The integrated chip includes an isolation structure arranged within a substrate and having surfaces defining one or more divots recessed below an uppermost surface of the isolation structure, the isolation structure defines an opening exposing the substrate; a source region disposed within the opening; a drain region disposed within the opening and separated from the source region along a first direction, the opening extends past opposing sides of the source region along a second direction perpendicular to the first direction; and a gate structure extending over the opening along the second direction. In some embodiments, a first one of the one or more divots includes a first segment extending within the isolation structure along the first direction and a second segment extending within the isolation structure along the second direction; and a line extending along a boundary between the source opening and the drain opening intersects the second segment. In some embodiments, the gate structure is configured to generate a channel region that extends within the substrate between the source region and the drain region; and opposing edges of the channel region are separated from the isolation structure by a non-zero distance. In some embodiments, the opening includes a source opening over the source region and having a first width defined by a first pair of sidewall of the isolation structure; a drain opening over the drain region and having a second width defined by a second pair of sidewalls of the isolation structure; and a channel opening between the source opening and the drain opening and having a third width defined by a third pair of sidewalls of the isolation structure larger, the third width is larger than the first width and the second width. In some embodiments, the integrated chip further includes sidewall spacers arranged along outer sidewalls of the gate structure, the opening transitions between the first width and the third width at a position that is directly below the sidewall spacers.

In yet other embodiments, the present disclosure relates to a method of forming an integrated chip. The method includes forming an isolation structure within a substrate, the isolation structure defines a source opening, a drain opening, and a channel opening arranged between the source opening and the drain opening along a first direction and extending past the source opening and the drain opening along a second direction perpendicular to the first direction; forming a gate structure over the channel opening; and performing an implantation process to form a source region within the source opening and a drain region within the drain opening, source region and the drain region set back from sidewalls of the isolation structure defining the channel opening by a non-zero distance along the second direction. In some embodiments, the isolation structure has surfaces defining one or more divots recessed below an uppermost surface of the isolation structure along an edge of the isolation structure that is proximate to the opening. In some embodiments, the gate structure is configured to generate a channel region that extends within the substrate between the source region and the drain region; and opposing edges of the channel region are separated from the isolation structure by a non-zero distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a substrate having interior surfaces that define a trench within an upper surface of the substrate;
one or more dielectric materials disposed within the trench;
a source region disposed within the substrate;
a drain region disposed within the substrate and separated from the source region along a first direction; and
a gate structure over the upper surface of the substrate between the source region and the drain region, wherein the upper surface of the substrate has a first width directly below the gate structure that is larger than a second width of the upper surface of the substrate within the source region or the drain region, the first width and the second width measured along a second direction that is perpendicular to the first direction.

2. The integrated chip of claim 1, wherein the first width is larger than widths of the upper surface of the substrate within both the source region and the drain region.

3. The integrated chip of claim 1, wherein the one or more dielectric materials have sidewalls that meet at twelve or more corners surrounding the upper surface of the substrate as viewed from a top-view of the substrate.

4. The integrated chip of claim 1, wherein the gate structure is disposed directly over a point where edges of the upper surface of the substrate intersect.

5. The integrated chip of claim 1, wherein the gate structure is configured to generate a conductive channel extending between the source region and the drain region, the conductive channel separated from the one or more dielectric materials by a non-zero distance measured along the second direction.

6. The integrated chip of claim 5, wherein the gate structure is configured to generate an electric field having a first value within the conductive channel and a second value laterally between the conductive channel and the one or more dielectric materials, wherein the second value is larger than the first value.

7. The integrated chip of claim 1,
wherein the gate structure is configured to generate a conductive channel extending between the source region and the drain region; and
wherein the gate structure has a protrusion extending outward from a lower surface of the gate structure facing the substrate, the protrusion laterally separated from the conductive channel by the substrate.

8. The integrated chip of claim 1, wherein the second width extends between outer edges of the upper surface of the substrate directly below the gate structure.

9. The integrated chip of claim 1,
wherein the one or more dielectric materials comprise sidewalls defining one or more divots recessed below an uppermost surface of the one or more dielectric materials; and
wherein the sidewalls continuously extend in a pattern having a cross like shape.

10. An integrated chip, comprising:
an isolation structure disposed within a substrate and surrounding an upper surface of the substrate, wherein the upper surface of the substrate has outer edges defining a cross shape as viewed from a top-view of the substrate;
a gate structure disposed over the upper surface of the substrate;
a source region disposed within the substrate along a first side of the gate structure; and
a drain region disposed within the substrate along a second side of the gate structure opposing the first side.

11. The integrated chip of claim 10, wherein the gate structure continuously extends from directly over the upper surface of the substrate to directly over the isolation structure.

12. The integrated chip of claim 10, wherein the gate structure continuously extends from over the upper surface of the substrate to below the upper surface of the substrate.

13. The integrated chip of claim 10, wherein a width of the upper surface of the substrate varies between multiple different widths between the source region and the drain region.

14. The integrated chip of claim 10,
wherein the isolation structure comprises interior surfaces defining one or more divots recessed below an uppermost surface of the isolation structure; and
wherein the upper surface of the substrate separates the one or more divots from a channel region that is between the source region and the drain region.

15. The integrated chip of claim 14, further comprising:
one or more conductive contacts disposed on the gate structure at one or more positions laterally separated from the upper surface of the substrate by the one or more divots.

16. An integrated chip, comprising:
a source region disposed within a substrate;
a drain region disposed within the substrate and separated from the source region along a first direction;
an isolation structure disposed within the substrate and surrounding the source region and the drain region;
a gate structure disposed over the substrate between the source region and the drain region; and
wherein an imaginary line, which extends along an edge of the source region or the drain region facing a second direction that is perpendicular to the first direction, is separated from the isolation structure by a non-zero distance along the second direction.

17. The integrated chip of claim 16,
wherein the gate structure is configured to generate an electric field that forms a conductive channel that extends within the substrate between the source region and the drain region; and
wherein opposing edges of the conductive channel are separated from the isolation structure by the substrate.

18. The integrated chip of claim 16,
wherein the isolation structure comprises interior surfaces defining one or more divots recessed below an uppermost surface of the isolation structure; and
wherein the one or more divots are separated from a conductive channel by an upper surface of the substrate.

19. The integrated chip of claim 16, wherein the isolation structure comprises interior sidewalls disposed directly over the isolation structure and extending in the first direction and in the second direction.

20. The integrated chip of claim 16, wherein the gate structure is directly over both a first sidewall of the isolation structure extending in the first direction and a second sidewall of the isolation structure extending in the second direction.

* * * * *